(12) United States Patent
Kashkoush et al.

(10) Patent No.: US 8,084,280 B2
(45) Date of Patent: Dec. 27, 2011

(54) METHOD OF MANUFACTURING A SOLAR CELL USING A PRE-CLEANING STEP THAT CONTRIBUTES TO HOMOGENEOUS TEXTURE MORPHOLOGY

(75) Inventors: Ismail Kashkoush, Orefield, PA (US); Gim-Syang Chen, Allentown, PA (US)

(73) Assignee: Akrion Systems, LLC

( * ) Notice: Subject to any disclaimer, the term of this patent is extended or adjusted under 35 U.S.C. 154(b) by 0 days.

(21) Appl. No.: 12/898,374

(22) Filed: Oct. 5, 2010

(65) Prior Publication Data

US 2011/0111548 A1    May 12, 2011

Related U.S. Application Data

(60) Provisional application No. 61/248,672, filed on Oct. 5, 2009.

(51) Int. Cl.
*H01L 21/00* (2006.01)
(52) U.S. Cl. .......... 438/19; 438/689; 216/97; 136/261
(58) Field of Classification Search .......... 438/19; 136/97
See application file for complete search history.

(56) References Cited

U.S. PATENT DOCUMENTS

| | | | |
|---|---|---|---|
| 4,137,123 A * | 1/1979 | Bailey et al. | 438/753 |
| 4,665,277 A | 5/1987 | Sah et al. | |
| 6,230,720 B1 * | 5/2001 | Yalamanchili et al. | 134/1.3 |
| 6,451,218 B1 * | 9/2002 | Holdermann | 216/99 |
| 6,479,395 B1 * | 11/2002 | Smith et al. | 438/723 |
| 7,219,677 B1 * | 5/2007 | Jackson | 134/94.1 |
| 2004/0108297 A1 * | 6/2004 | Erk et al. | 216/2 |
| 2009/0311821 A1 | 12/2009 | Dimitrov et al. | |

FOREIGN PATENT DOCUMENTS

| | | |
|---|---|---|
| JP | 3288476 | 12/1991 |
| KR | 20080062515 | 7/2008 |
| WO | W02009120631 A1 | 10/2009 |
| WO | W02010081505 | 7/2010 |
| WO | W0201011573041 | 10/2010 |

OTHER PUBLICATIONS

Marshall et al., "Environmentally friendly wet cleans protect yields, bottom line", Solid State Technology, Nov. 2004, pp. 24 & 27.*
Svetoslav Koynov et al., "Black Multi-Crystaine Silicon Solar Cells," phys.stat.sol (RRL) 1, No. 2, R53-R55 (2007), Germany.
Stangle Semiconductor Equipment AG, "SILEX We Process Equipmen for c-Si Soiarcell Production Lines," (2008) Germany.

* cited by examiner

*Primary Examiner* — W. David Coleman
(74) *Attorney, Agent, or Firm* — The Belles Group, P.C.

(57) ABSTRACT

A method of manufacturing a solar cell wherein a pre-cleaning step is completed prior to a saw damage removal step and prior to texturization, thereby resulting in the subsequently formed textured surface to have a more homogeneous textural morphology. In one aspect, the invention is a method comprising: a) applying a pre-cleaning solution to an as-cut surface of a crystalline silicon substrate to remove surface contaminants, thereby converting the as-cut surface to a pre-cleaned surface, the as-cut surface formed by a sawing process to create the crystalline silicon substrate; b) applying a first etching solution to the pre-cleaned surface to remove physical damage caused during the sawing process, thereby converting the pre-cleaned surface into a prepared surface; c) applying a second etching solution to the prepared surface to texturize the prepared surface, thereby converting the prepared surface into a texturized surface; and d) forming at least one solar cell on the texturized surface of the crystalline silicon substrate.

20 Claims, 8 Drawing Sheets

(b)

| Supplier | Wafer Size | Crystal Growth | Conductivity Type | Approx. Thickness |
|---|---|---|---|---|
| A | 156 mm | Cz | P | 210 µm |
| F | 125 mm | Cz | P | 180 µm |
| T | 125 mm | Fz | N | 240 µm |
| R | 125 mm | Cz | N | 200 µm |
| S | 125 mm | Fz | N | 220 µm |

| Sample | Process | | | Rfl% (Avg) @ 950 nm | Rfl% (Stdev) @ 950 nm |
|---|---|---|---|---|---|
| | Pre-Clean | HF Dip | Texturization + post-clean | | |
| A-21 | APM | Applied | BKM | 9.22 | 0.10 |
| A-22 | | | | 9.47 | 0.11 |
| A-23 | | Not Applied | | 9.41 | 0.07 |
| A-24 | | | | 9.50 | 0.21 |
| A-27 | KPM-1 | Applied | | 9.42 | 0.15 |
| A-28 | | | | 9.13 | 0.10 |
| A-29 | | Not Applied | | 9.13 | 0.14 |
| A-30 | | | | 9.31 | 0.13 |
| A-33 | KPM-2 | Applied | | 9.34 | 0.10 |
| A-34 | | | | 9.46 | 0.09 |
| A-35 | | Not Applied | | 9.39 | 0.13 |
| A-36 | | | | 9.36 | 0.12 |
| A-39 | Not Applied | Applied | | 9.05 | 0.10 |
| A-40 | | | | 9.05 | 0.29 |
| A-41 | | Not Applied | | 9.07 | 0.32 |
| A-42 | | | | 9.10 | 0.13 |

| Sample | Pre-Clean Process | Texturing Etch Rate (normalized) | Average Etch Rate (normalized) | Avg Refl% @ 950nm | Refl% (Stdev) |
|---|---|---|---|---|---|
| F-13 | Applied | 1.00 | 0.99 | 9.23 | 0.07 |
| F-15 | Applied | 0.98 | | 9.48 | 0.10 |
| T-11 | Applied | 1.07 | 1.04 | 9.38 | 0.08 |
| T-18 | Applied | 1.06 | | 9.41 | 0.08 |
| T-21 | Not Applied | 0.99 | | 9.65 | 0.25 |
| R-13 | Applied | 0.76 | 0.76 | 9.83 | 0.43 |
| R-14 | Not Applied | 0.75 | | 9.57 | 0.29 |
| S-10 | Applied | 0.81 | 0.82 | 10.06 | 0.21 |
| S-11 | Not Applied | 0.83 | | 10.10 | 0.16 |

METHOD OF MANUFACTURING A SOLAR CELL USING A PRE-CLEANING STEP THAT CONTRIBUTES TO HOMOGENEOUS TEXTURE MORPHOLOGY

CROSS-REFERENCE TO RELATED PATENT APPLICATIONS

The present application claims the benefit of U.S. Provisional Patent Application 61/248,672, filed Oct. 5, 2009, the entirety of which is hereby incorporated by reference.

FIELD OF INVENTION

The present invention relates generally to the field of forming solar cells, and specifically to methods of forming solar cells that includes a pre-cleaning step prior to texturization.

BACKGROUND OF THE INVENTION

Solar energy is a very promising clean energy. A solar cell which can directly convert solar light into electricity has been the focus recently. One of the major requirements for obtaining a high-efficiency solar cell is to enhance the absorption of solar light. All high-efficiency crystalline silicon solar cells up to date are textured on the front surface to reduce the reflection losses and to improve the light-trapping properties. Texturization of crystalline silicon is one of the essential processes in solar cell manufacturing. A well-textured wafer surface enhances the effectiveness of light absorption to a solar cell, which is deemed to be important for a cell's IQE (internal quantum efficiency).

In view of the above, the industry continues to try improve the texturization of the crystalline silicon substrate to reduce reflectivity. To date, efforts are placed on tuning the texturing process parameters to control size and uniformity of the textured structures. Little attention has been paid to the variables of wafer surface qualities and the effects of pre-texture surface conditioning on the texturization results.

SUMMARY OF THE INVENTION

The present invention is directed to a method of forming a solar cell in which a pre-cleaning step and a saw damage removal step is performed prior to texturization. As a result of these pre-texturization steps, it has been discovered that the subsequently formed textured surface exhibits a more uniform textural morphology.

In one aspect, the invention is a method of manufacturing a solar cell comprising: a) applying ozonated deionized water to an as-cut surface of a crystalline silicon substrate to remove surface contaminants, thereby converting the as-cut surface to a pre-cleaned surface, the as-cut surface formed by a sawing process to create the crystalline silicon substrate; b) applying a first etching solution to the pre-cleaned surface to remove physical damage caused during the sawing process, thereby converting the pre-cleaned surface into a prepared surface; c) applying a second etching solution to the prepared surface to texturize the prepared surface, thereby converting the prepared surface into a texturized surface; and d) forming at least one solar cell on the texturized surface of the crystalline silicon substrate.

In another aspect, the invention is a method of manufacturing a solar cell comprising: a) applying a first aqueous solution of potassium hydroxide or sodium hydroxide to an as-cut surface of a crystalline silicon substrate to remove surface contaminants, thereby converting the as-cut surface to a pre-cleaned surface, the as-cut surface formed by a sawing process to create the crystalline silicon substrate; b) applying a second aqueous solution of potassium hydroxide or sodium hydroxide to the pre-cleaned surface to remove physical damage caused during the sawing process, thereby converting the pre-cleaned surface into a prepared surface, wherein the first aqueous solution of potassium hydroxide or sodium hydroxide has a first concentration of potassium hydroxide or sodium hydroxide and the second aqueous solution of potassium hydroxide or sodium hydroxide has a second concentration of potassium hydroxide or sodium hydroxide that is greater than the first concentration; c) applying an alkaline solution to the prepared surface to texturize the prepared surface, thereby converting the prepared surface into a texturized surface; and d) forming at least one solar cell on the texturized surface of the crystalline silicon substrate.

In yet another aspect, the invention is a method of manufacturing a solar cell comprising: a) applying a pre-cleaning solution to an as-cut surface of a crystalline silicon substrate to remove surface contaminants, thereby converting the as-cut surface to a pre-cleaned surface, the as-cut surface formed by a sawing process to create the crystalline silicon substrate; b) applying a first etching solution to the pre-cleaned surface to remove physical damage caused during the sawing process, thereby converting the pre-cleaned surface into a prepared surface; c) applying a second etching solution to the prepared surface to texturize the prepared surface, thereby converting the prepared surface into a texturized surface; and d) forming at least one solar cell on the texturized surface of the crystalline silicon substrate.

DETAILED DESCRIPTION OF THE DRAWINGS

The present invention is directed to the addition of a pre-texturization cleaning step used in the manufacture of solar cells from crystalline silicon substrates. As disclosed herein, it has been surprisingly discovered that the pre-cleaning of crystalline silicon substrates (i.e., prior to texturization) can significantly improve the homogeneity of the morphology of the textural structures formed during the subsequently performed texturing process. This is contrary to the accepted understanding in the art where it was assumed that the saw damage removal step was sufficient to prepare the surfaces of the crystalline silicon substrates for processing. However, the inventors of the present application discovered that the saw damage removal step is inadequate for removing many types of contaminants, which can lead to an inhomogeneous morphology of the textural structures (e.g., pyramids) formed during the texturizing step.

The pre-cleaning step is performed prior to the saw damage removal step and, thus, is performed to the as-cut surface(s) of the crystalline silicon substrates. As used herein, the term as-cut surfaces includes the surfaces of crystalline silicon substrates resulting from both slicing wire sawing techniques. Additionally, the term "sawing" is used to refer to any cutting process that is used to cut individual substrates from a larger bulk structure of silicon. Furthermore, as used herein, the crystalline silicon substrates can be formed of either monocrystalline silicon or multicrystalline silicon. Finally, at times through this specification, the term "wafer" is used to refer to a "crystalline silicon substrate."

In accordance with the present invention, the solar cell manufacturer receives (or forms) crystalline silicon substrates that have been sliced or sawed from a larger bulk structure of silicon. At this initial stage, the crystalline silicon substrates include as-cut surfaces which include both physical damage resulting from the sawing process and from contaminants. Examples of contaminants include without limitation organic, inorganic, films, ionic and particulate contaminants.

According to the present invention, the crystalline silicon substrates having the as-cut surfaces are subjected to a pre-cleaning process step. In this pre-cleaning process step, a pre-cleaning solution is applied to the as cut-surface(s) of the crystalline silicon substrates to remove contaminants, thereby converting the as-cut surface(s) to pre-cleaned surface(s). The application of the pre-cleaning solution can be accomplished by a variety of methods, including without limitation, bath immersion, spraying, nozzle dispensing, and/or combinations thereof. Suitable pre-cleaning solutions include ozonated deionized water ($DIO_3$), $HF/O_3$ and a dilute aqueous solution of potassium hydroxide or sodium hydroxide. In one embodiment in which the pre-cleaning solution is a dilute aqueous solution of potassium hydroxide or sodium hydroxide, the pre-cleaning solution will have a potassium hydroxide or sodium hydroxide concentration in a range between about 0.1% and 5% by weight (with the remainder being deionized (DI) water), and most preferably between 0.1% and 1% by weight (with the remainder being DI water). In other embodiments, the pre-cleaning solution may be APM, KPM, $HF/O_3$, $HF/HNO_3$, or combinations thereof. Of course, other pre-cleaning solution may be used in certain embodiments. The exact parameters, such as time of exposure and choice of pre-cleaning solution, may be optimized for the specific crystalline silicon substrates being used.

Once the pre-cleaning step is complete, a saw damage removal solution is applied to the pre-cleaned surface(s) of the crystalline silicon substrates to remove physical damage caused during the sawing process, thereby converting the pre-cleaned surface into a prepared surface. The application of the saw damage removal solution can be accomplished by a variety of methods, including without limitation, bath immersion, spraying, nozzle dispensing, and/or combinations thereof. The saw damage removal solution is preferably an etching solution that, when applied to the crystalline silicon substrates, removes a layer of the silicon from the crystalline silicon substrates. In one embodiment, the layer removed may be less than the entirety of the saw damage zone. In one embodiment, the saw damage removal solution is an aqueous solution of potassium hydroxide or sodium hydroxide. In embodiments where the pre-cleaning solution is also an aqueous solution of potassium hydroxide or sodium hydroxide, the concentration of the potassium hydroxide or sodium hydroxide in the saw damage removal solution will be substantially greater than the concentration of the potassium hydroxide or sodium hydroxide in the pre-cleaning solution. In one embodiment, the saw damage solution will have a potassium hydroxide or sodium hydroxide concentration in a range between about 20% and 20% by weight (with the remainder being deionized (DI) water), and most preferably between 25% and 35% by weight (with the remainder being DI water).

Upon completion of the saw damage removal step, a texturization step is carried out. During the texturization step, an etching solution is applied to the prepared surface(s) of the crystalline silicon substrates to texturize the prepared surface, thereby converting the prepared surface into a texturized surface. The application of the etching solution can be accomplished by a variety of methods, including without limitation, bath immersion, spraying, nozzle dispensing, and/or combinations thereof. While a number of techniques have been developed for surface texturization, anisotropic etching with a hot alkaline solutions is preferably used, especially if monocrystalline silicon is being used. In certain embodiments, the etching solution used in the texturization step can be an aqueous solution of KOH and IPA, an aqueous solution of NaOH and IPA or an aqueous solution of KOH and surfactant(s).

The application of the texturing etching solution to the prepared surface(s) of the crystalline silicon substrates forms pyramids on the prepared surface(s) of the crystalline silicon substrates. The pre-cleaning step has surprisingly resulting in the textured surface being formed during the texturization step to have an improved homogeneity for the textural morphology. As a result, overall surface reflectance of the textured surfaces of the crystalline silicon substrates is reduced. With the attempt to further optimize c-Si cell performance, the role of textured surface morphology (i.e. pyramid size, distribution, etc.) is key advancement of the art. Depending on the desired solar cell structure, textured substrates featuring relatively large (or small) pyramid size can be created.

Finally, as discussed in greater detail below, it has been discovered that an etching step that has been previously used as a pre-texturization step to remove native and/or chemical oxides is essentially negligible and can be eliminated. Thus, in one embodiment of the inventive method, the pre-cleaning step, the saw damage removal step, and the texturization step describe above are performed sequentially and without a dedicated etching step, for example one that uses an aqueous HF solution, being performed to the crystalline silicon substrates to remove native and/or chemical oxides formed on the silicon. As used herein, dedicated means a separate and distinct process step, for example, one carried out in a separate tank and/or bath. Of course, an amount of etchant may be included in the pre-cleaning step, although it is not necessary in all embodiments.

Once the texturization step is complete, at least one solar cell is formed on the texturized surface of the crystalline silicon substrates by techniques well known in the art. Such techniques are not germane to the present invention and need no further discussion herein.

EXPERIMENT

Experiments were performed to investigate the effect of pre-cleaning on surface texturization of mono-crystalline silicon in an KOH/IPA solution. Without appropriate pre-cleaning, surface contamination can cause the formation of pyramids with smaller sizes than those at the non-contaminated areas. This leads to inhomogeneous texture features and reflectance non-uniformity on the wafer surface. Depending on the supplier, the surface quality and contamination level of wafers may vary and the pre-cleaning condition may need to be tailored to achieve consistent and desired texturization results.

Figure 1:
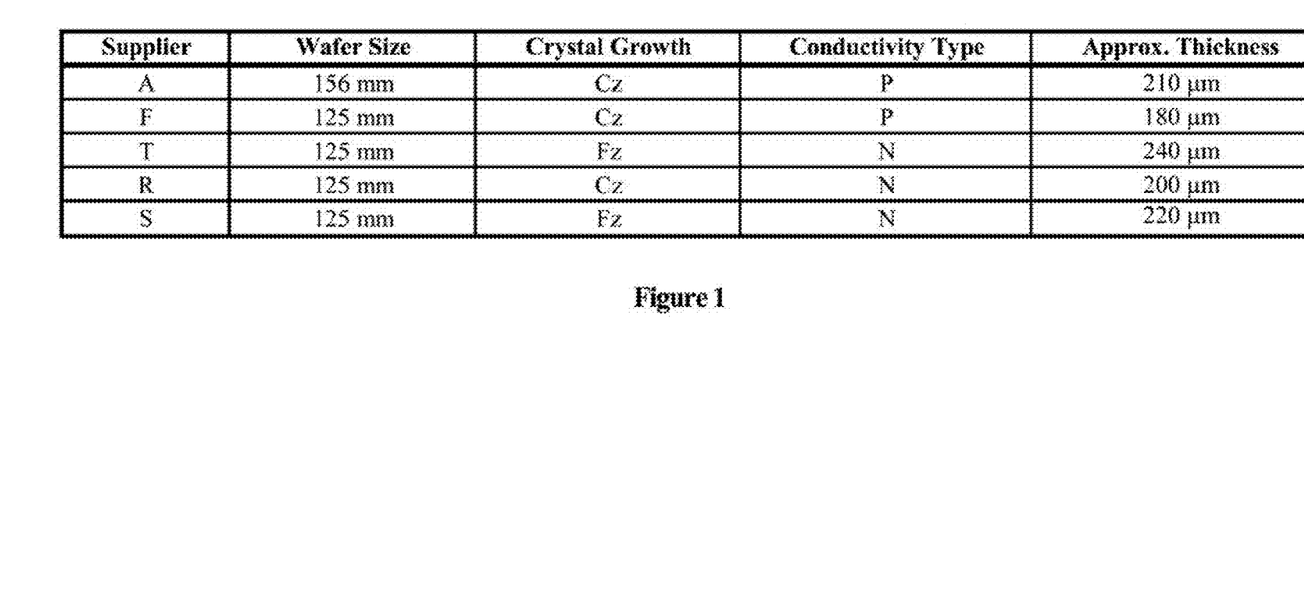
FIG. 1 is a table of data relating to wafers provided by different suppliers, which were used in an experiment according to one embodiment of the present invention.

Referring to FIG. 1, a number of c-Si solar wafers manufactured by various suppliers were used in the experiments. Five different suppliers were used (A, F, T, R, and S). The specific wafering process employed by each individual supplier is unknown, but the wafers are presumed to have gone through the typical process flow of wire-sawing, debonding, cleaning and packaging.

Wet chemical processes were conducted on a GAMA™ wafer cleaning station in Akrion's Applications Laboratory. The typical sequence of the experiment was pre-texture cleaning, texturization and post-texture cleaning. Prior to texturization, split lots were run with various pre-clean conditions using alkaline, acidic or the combination. Texturization and post-clean was performed with a fixed condition of KOH/IPA and HF/HCl, respectively.

Figure 2:
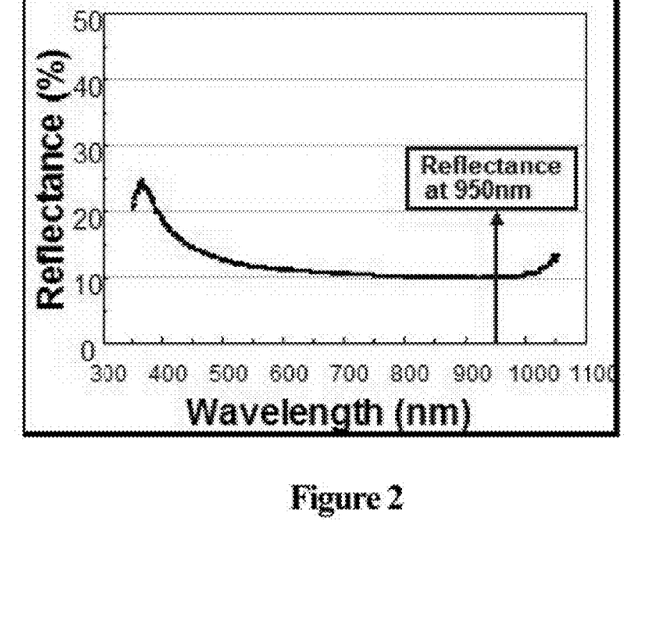
FIG. 2 is a graph of a typical reflectance spectrum and representative reading at 950 nm for a spot measurement on a crystalline silicon substrate.

Silicon removal of the tested wafers was estimated by a weight loss measurement technique using a microbalance (with a 0.1 mg sensitivity) operated in a stagnant airflow chamber. Reflectance of wafer surfaces was measured using a spectrophotometer with an integrating sphere (probe size of 10 mm). Referring to FIG. 2, the reading at 950 nm wavelength was used to indicate the reflectance of a measured spot on the wafer.

Figure 3:
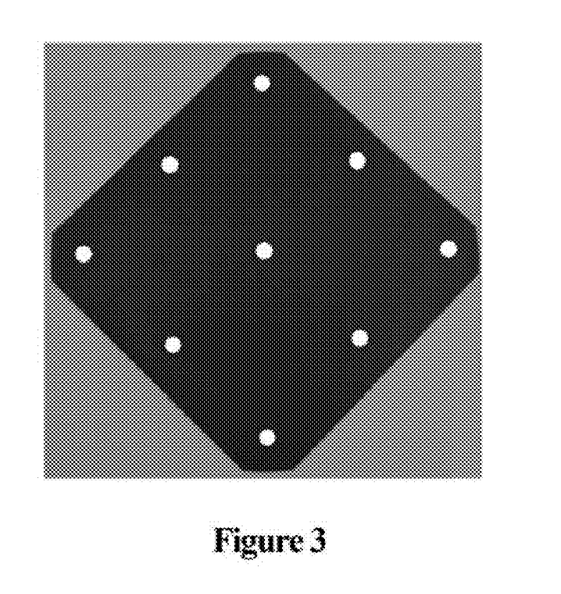
FIG. 3 is a schematic identifying the locations of the nine measurement points on the crystalline silicon substrate used in the experiment of the present invention.

Referring to FIG. 3, nine spots were measured across the surface of each individual wafer to evaluate the reflectance uniformity. Following the measurements, an average value and one standard deviation was calculated. Further, surface morphology images were obtained using optical microscopy and SEM (scanning electron microscopy) techniques, as will be described in more detail below.

Next, the effects of pre-cleaning the wafers will be discussed in detail, with specific emphasis on the texturization results. Using wafers from supplier A, split lots with and without pre-clean and HF dip were run. APM, KPM-1, and KPM-2 were used as pre-cleaning fluids. The wafers were then processed together to receive the texturization and post-clean treatments.

Figure 4:
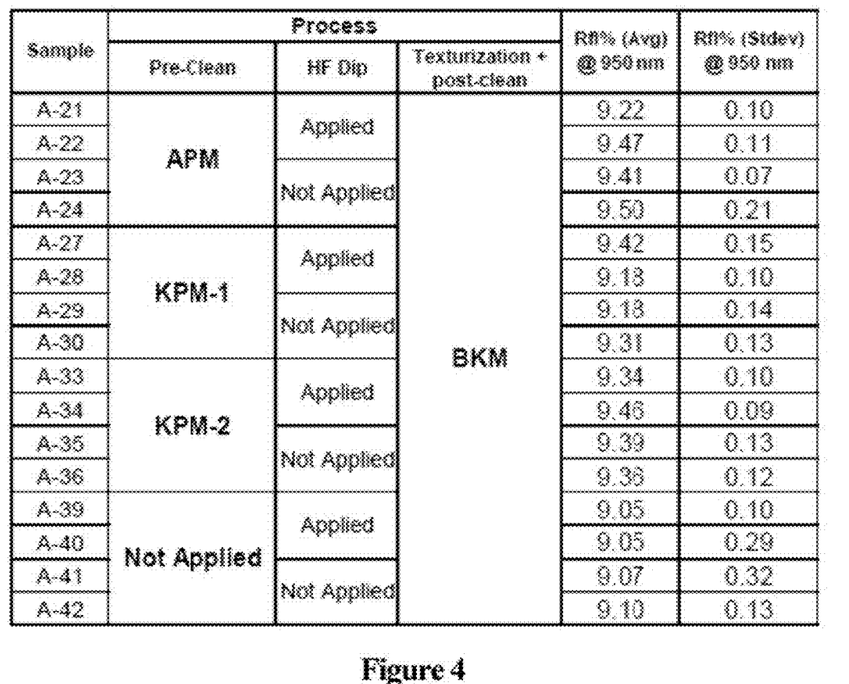
FIG. 4 is a table of a test matrix of pre-cleans and corresponding reflectance results from the experiment according to the present invention.

Referring to FIG. 4, the test matrix and reflectance results are presented. It can be seen that there was little difference in reflectance (average and standard deviation) between the wafers with an HF-dip versus those without. HF-dip treatments prior to alkaline etching are normally applied in semiconductor/MEMS device fabrication to remove the native and/or chemical oxide from silicon surfaces for etch-precision purpose. In the texturing of solar wafers, the etching depth requirement is not as stringent as in semiconductor processes. The delay of silicon texturing due to the existence of a thin layer of native oxide was about 5-10 seconds in the present experiments. This was calculated by counting when a large amount of hydrogen bubbles started to emerge from wafer surfaces. This delay of only 5-10 seconds is a very small fraction of the entire texturization process time, which usually lasts approximately 30 minutes. Therefore, the HF-dip step is relatively negligible in the solar wafer texturing process flow.

Figure 5:
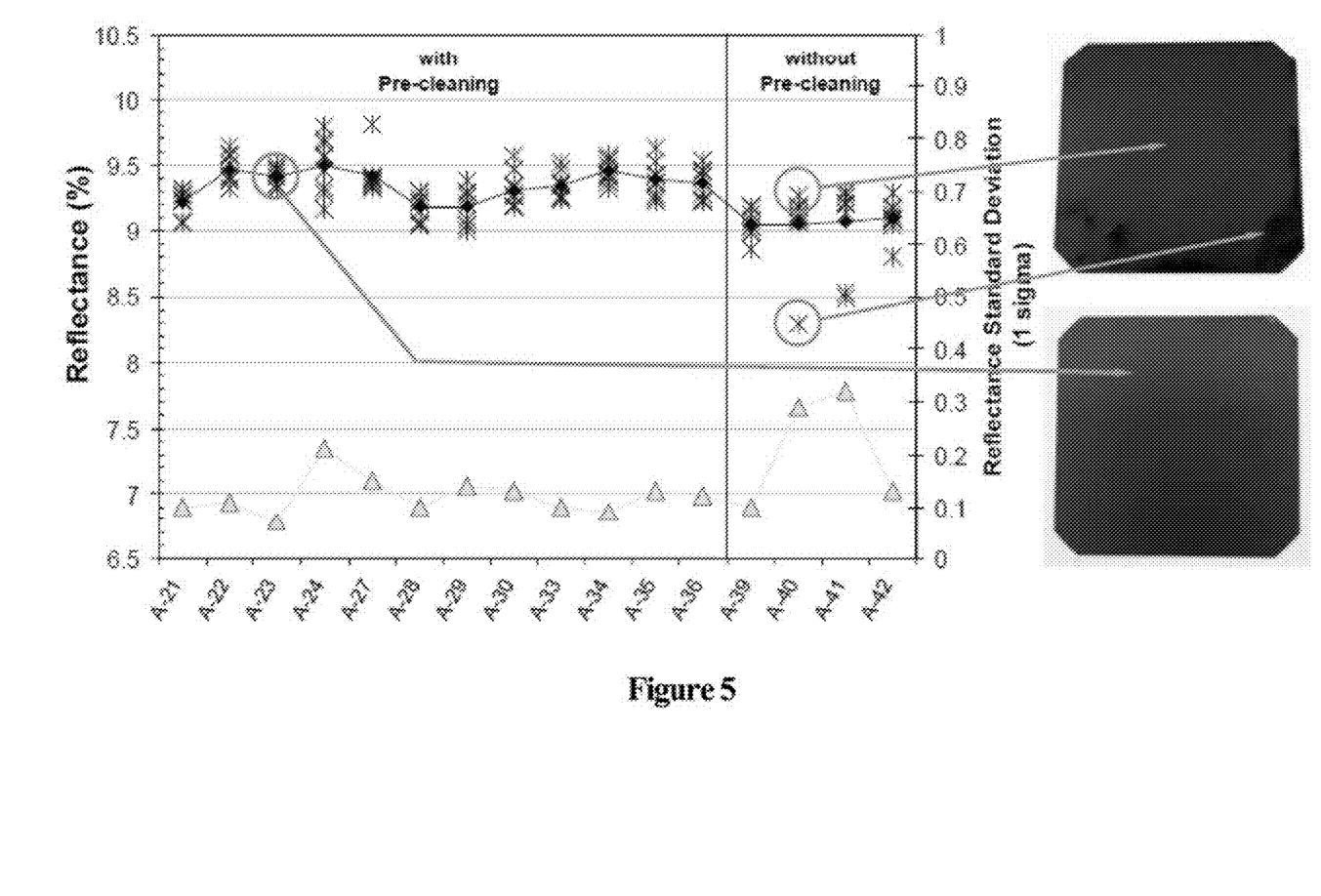
FIG. 5 is a graph and corresponding figures of the nine-point measurement data showing the effects of pre-cleaning on the uniformity of reflectance across the crystalline silicon substrates according to the experiment of the present invention.

Wafers without pre-cleaning showed a higher tendency of reflectance non-uniformity (i.e. standard deviation>absolute 0.2%). Referring to FIG. 5, the reflectance results of FIG. 4 along with the nine-point measurement data of each wafer is illustrated. Relative dark spots, indicating areas of low reflectance, were commonly observed for those wafers textured without pre-cleaning. This indicates noticeable texture non-uniformity in those wafers textured without the pre-cleaning method of the present invention.

Figure 6A:
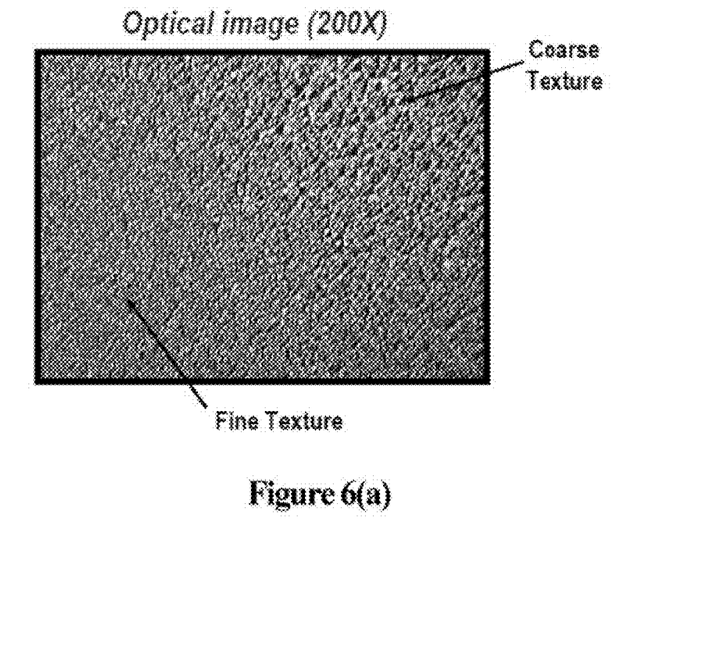
FIG. 6a is an optical microscopy image showing the surface morphology of an inconsistently textured area of a crystalline silicon substrate when the inventive pre-cleaning step is not utilized.
Figure 6B:
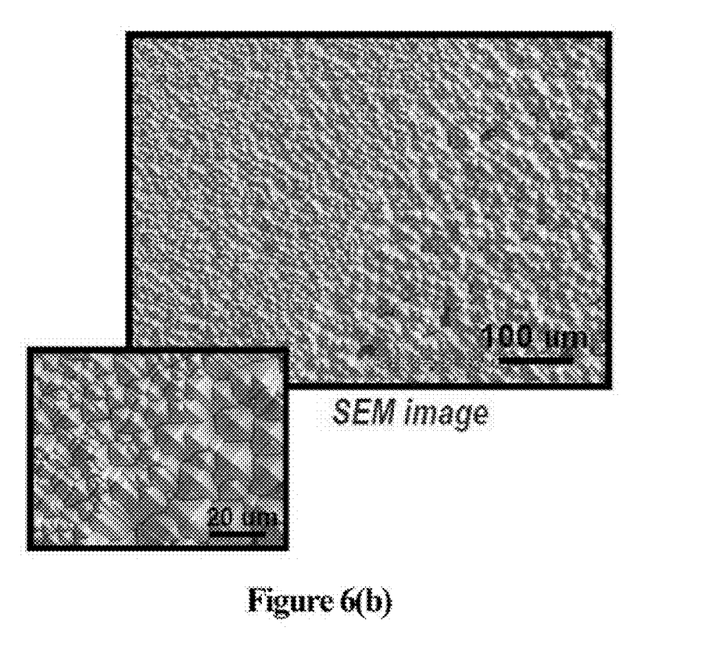
FIG. 6b is a SEM image showing the surface morphology of the inconsistently textured areas of the crystalline silicon substrate of FIG. 6A.

Referring to FIG. 6(a), examinations of surface morphology indicated that the reflectance variation is associated with the inhomogeneity of texture features. Referring to FIG. 6(b), further analysis with SEM showed that this resulted from an abrupt change of pyramid sizes from an area to another. The area of low reflectance was found to correspond with the area of small pyramids. Since a pre-cleaned wafer surface intentionally touched with a cleanroom glove can show the dark patterns at the corresponding areas after texturization, the texturing inconsistency seemed to be due to the surface contamination of the solar wafers.

Next, the effects of silicon etching on pre-cleaning efficiency will be discussed in detail. Additional experiments were performed on wafers from different suppliers. By skipping the HF dip, a number of test wafers from each group of F-, T-, R- and S-supplier were processed with pre-clean using the clean-1 recipe and without pre-clean. This was followed by the same texturization and post-cleaning processes.

Figure 7:
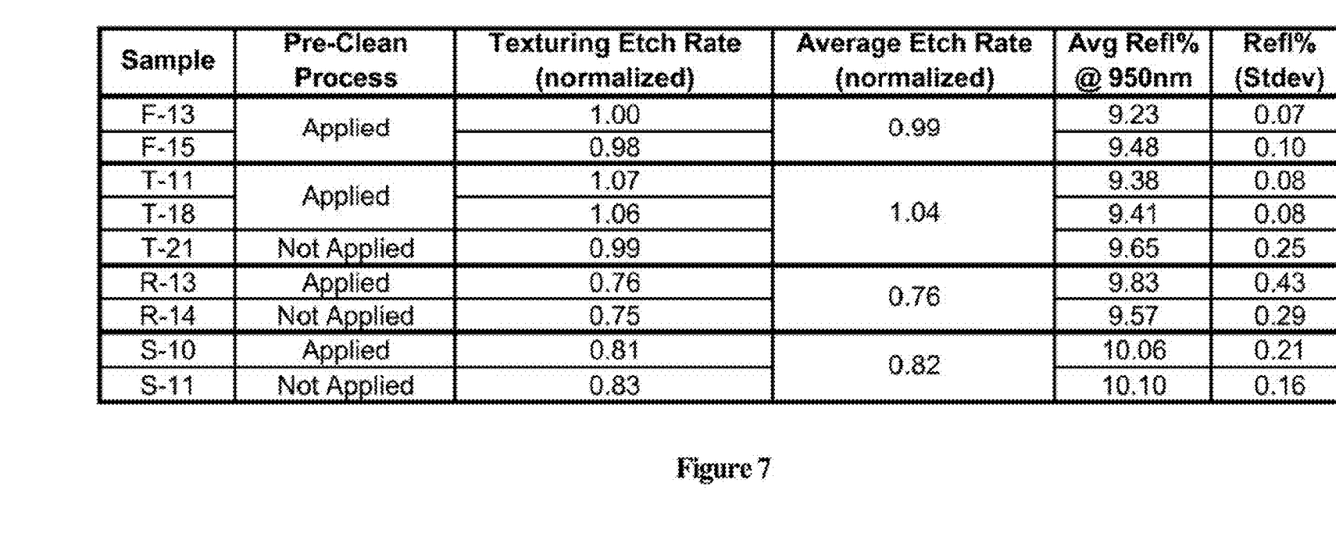
FIG. 7 is a comparative table showing the texturing etch rates and reflectance results between different crystalline silicon substrates that have been subjected to the method of the present invention and different crystalline silicon substrates that have not been subjected to the method of the present invention.

Referring to FIG. 7, the wafers from different suppliers showed different texturing performance. Wafers from group F and T exhibited consistent texturing etch rates and reflectance response when compared to the previous test results obtained from wafer group A. The texturing uniformity was fairly decent (reflectance deviation≦absolute 0.1%) except that the wafer that did not receive the pre-clean in advance (wafer #T-21, reflectance deviation=0.25%).

Wafers from group R and S showed significantly low texturing etch rates compared to the other groups (i.e. F and T). Also, regardless of the pre-clean, reflectance deviation of the R- and S-wafers was relatively high (mostly>0.2%), indicating an inconsistent texturization across the wafer surface.

Figure 8:
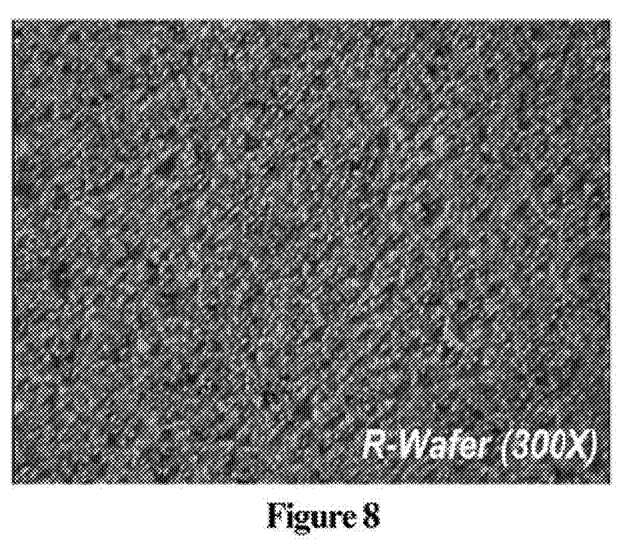
FIG. 8 is an optical microscopy image showing the surface morphology of a wafer from group R of FIG. 7.
Figure 9:
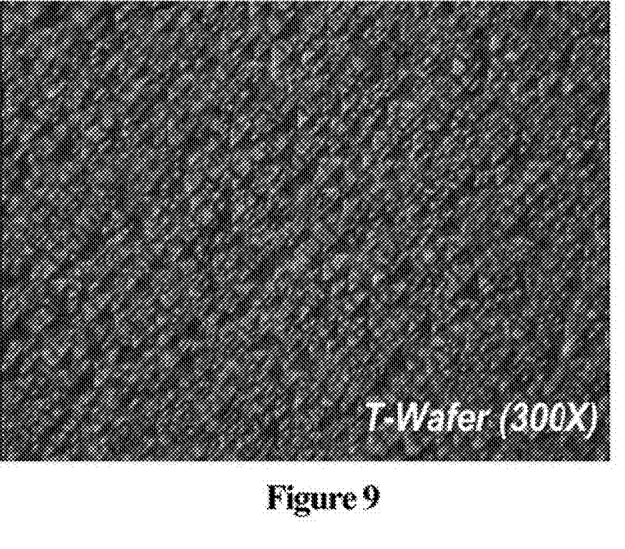
FIG. 9 is an optical microscopy image showing the surface morphology of a wafer from group T of FIG. 7.

Referring to FIGS. 8 and 9, images taken with an optical microscope under the same magnification of the wafers from group R and S and wafers from group F and T are illustrated. The wafers from group R and S revealed noticeably finer texture features than the wafers from group F and T. The observations of low texturing etch rates and overall fine textures seemed to imply that bulk material issues could be a factor other than regional surface-contamination affecting the texturization results.

With cross-comparison of the information between FIG. 1 and FIG. 7, no correlation can be found between the supplierdependent texturing behaviors and the crystal growth method and the conductivity type, suggesting that those observed are not primarily related with the bulk silicon material. Given that the SC1, Clean-1, and Clean-2 recipes mostly removed submicron levels of Si from a wafer, it was postulated that a thicker layer of Si might need to be removed before a consistent texturing result can be obtained among the wafers from different suppliers. To verify the hypothesis, pre-texturing treatments with various etching conditions were applied to a set of test wafers from supplier F, S and R. The etching conditions were tailored to achieve different levels of Si removal prior to the application of the texturization process.

Figure 10:
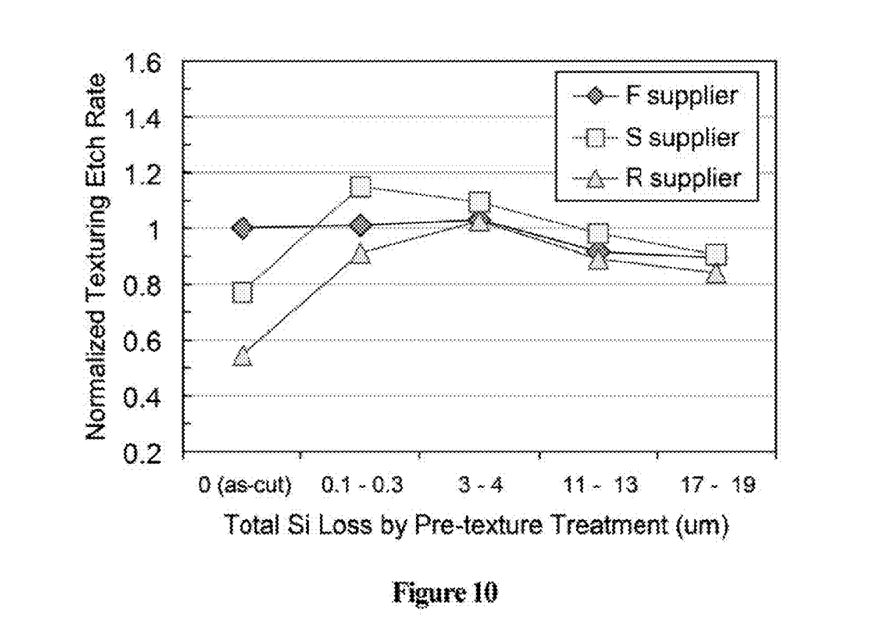
FIG. 10 is a graph showing the texturing etch rate versus the total thickness of silicon removed from the surfaces of crystalline silicon substrates when subjected to the pre-texture treatments of the present invention.

Referring to FIG. 10, the texturing etch rate versus the total thickness of silicon removed from wafer surfaces by the pre-texture treatments is illustrated. For better comparison, the texturing etch rate of all tested wafers are normalized against one F-wafer without any pre-texture treatment (i.e. as-cut wafer). FIG. 10 shows that the texturing etch rate of F-wafers displayed little change until greater than 10 μm of superficial silicon had been removed by the pre-texture etching. This amount of superficial silicon is believed to be about the majority of the saw damage zone (SDZ) that has been induced by the wafer wire-sawing processes. The high-energy state of the SDZ normally causes much more active etching reactions than the bulk material and thus increases the overall etch rate of texturization. Once the SDZ is etched away, the Si texturing etch rate slightly decreases.

In contrast to F-wafers, the R- and S-wafers showed relatively low etch rates at the as-cut state where most of the SDZ was in presence. The etch rates increased as more SDZ had been removed by pre-texture etching and eventually "converged" to the similar level of F-wafer texturing rates when approximate 3-4 μm of silicon had been pre-removed from the initial as-cut surface.

Figure 11:
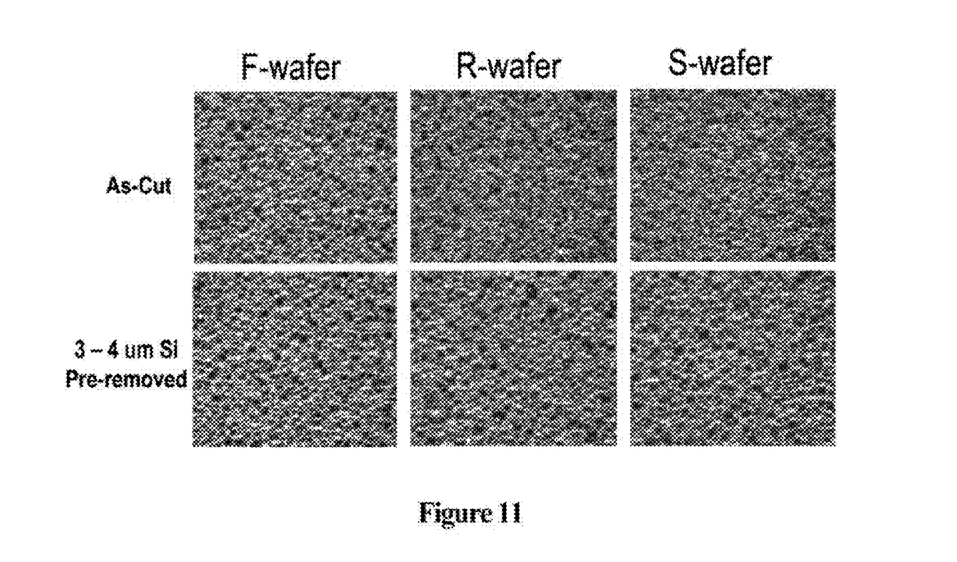
FIG. 11 is optical microscopy images showing the surface's of crystalline silicon substrates from group R, S, and T, both As-Cut and with 3-4 um of Si pre-removed.

Referring to FIG. 11, texture features of the F-, R-, and S-wafers versus the level of pre-texture etching is illustrated. For the as-cut surface, R- and S-wafers exhibited relatively fine features compared to the F-wafers. Further, all three groups showed similar surface textures after a sufficient pre-removal of silicon material.

The experimental results have shown that the alkaline texturing of (100) c-Si wafers is strongly influenced by the initial surface state of the substrate. Gosálvez and Nieminen have developed a mechanistic model to delineate the nucleation and growth of pyramidal hillocks during anisotropic etching of c-Si, and used Monte Carlo simulation to predict the pyramidal texturing process with results consistent with published experimental observations. They suggested in their model that impurities in the etching solution play a key role in the nucleation of the hillock by masking a superficial Si atom at the plane to form the apex of a pyramid; once the apex atom is "stabilized" by the impurities, the planes start to develop due to their relatively low etch rate to other major index planes, and a pyramidal hillock forms and grows.

In the present invention, micro-contaminants distributed on wafer surfaces seem to serve perfectly as the impurities for nucleation, enhancing intensive formation of pyramids on the contaminated areas. Therefore, the inhomogeneous pyramid distribution leads to reflectance non-uniformity across the wafer. The HF-dip step is an effective chemistry to remove native oxide on Si surfaces. However, the HF-dip step barely etches Si, seems to be insufficient for removing the surface contamination, and has little effect on reflectance uniformity. A pre-texturing treatment capable of producing both the cleaning and etching effects on silicon is therefore preferred. Since there are normally many micro-cracks appearing at an as-cut surface, the degree of surface contamination could be beyond the "surface level" and might vary largely with wafer suppliers depending on their wafering, cleaning and packaging processes. A pre-clean step may have to be adjusted against the surface qualities of incoming wafers to obtain consistent and desired texturization outcome. However, the pre-cleaning step does not need to carry out a complete SDZ removal according to the experimental results.

By applying various cleaning conditions and using wafers from different suppliers, the effect of pre-cleaning on the texturization of mono-crystalline silicon solar wafers in a KOH/IPA solution was investigated. Experimental results indicated that with the lack of proper pre-cleaning, relatively small pyramids preferred to form at the contaminated areas and cause inhomogeneous texture distribution on wafer surfaces. The texture inhomogeneity can be revealed by noticeable variations of the reflectance across the wafer surface (e.g. one-sigma standard deviation>absolute 0.2% from a set of nine-point measurement data in this case). In addition, depending on the supplier, wafer surface qualities could vary so much that relatively aggressive cleaning/etching processes were required prior to the texturization to achieve consistent texturing performance.

While a number of embodiments of the current invention have been described and illustrated in detail, various alternatives and modifications will become readily apparent to those skilled in the art without departing from the spirit and scope of the invention.

What is claimed is:

1. A method of manufacturing a solar cell comprising:
    a) applying ozonated deionized water to an as-cut surface of a crystalline silicon substrate to remove surface contaminants, thereby converting the as-cut surface to a pre-cleaned surface, the as-cut surface formed by a sawing process to create the crystalline silicon substrate;
    b) applying a first etching solution to the pre-cleaned surface to remove physical damage caused during the sawing process, thereby converting the pre-cleaned surface into a prepared surface;
    c) applying a second etching solution to the prepared surface to texturize the prepared surface, thereby converting the prepared surface into a texturized surface; and
    d) forming at least one solar cell on the texturized surface of the crystalline silicon substrate.

2. The method of claim 1 wherein step a) comprises immersing the crystalline silicon substrate in a bath of ozonated deionized water, step b) comprises immersing the crystalline silicon substrate in a bath of the first etching solution, and step c) comprises immersing the crystalline silicon substrate in a bath of the second etching solution.

3. The method of claim 1 wherein the second etching solution is alkaline solution.

4. The method of claim 1 wherein the alkaline solution is an aqueous solution of potassium hydroxide and isopropyl alcohol.

5. The method of claim 1 wherein the performance of step a) results in the textured surface formed in step c) having a substantially homogeneous textural morphology.

6. The method of claim 1 wherein the textured surface comprises pyramid structures.

7. The method of claim 1 wherein steps a) through c) are performed sequentially and without a dedicated aqueous HF solution being applied to the crystalline silicon substrate.

8. The method of claim 1 wherein a layer of the crystalline silicon substrate is removed during step b).

9. The method of claim 1 wherein the layer of the crystalline silicon substrate removed during step b) is less than the entirety of the saw damage zone.

10. A method of manufacturing a solar cell comprising:
a) applying a first aqueous solution of potassium hydroxide or sodium hydroxide to an as-cut surface of a crystalline silicon substrate to remove surface contaminants, thereby converting the as-cut surface to a pre-cleaned surface, the as-cut surface formed by a sawing process to create the crystalline silicon substrate;
b) applying a second aqueous solution of potassium hydroxide or sodium hydroxide to the pre-cleaned surface to remove physical damage caused during the sawing process, thereby converting the pre-cleaned surface into a prepared surface, wherein the first aqueous solution of potassium hydroxide or sodium hydroxide has a first concentration of potassium hydroxide or sodium hydroxide and the second aqueous solution of potassium hydroxide or sodium hydroxide has a second concentration of potassium hydroxide or sodium hydroxide that is greater than the first concentration;
c) applying an alkaline solution to the prepared surface to texturize the prepared surface, thereby converting the prepared surface into a texturized surface; and
d) forming at least one solar cell on the texturized surface of the crystalline silicon substrate.

11. The method of claim 10 wherein step a) comprises immersing the crystalline silicon substrate in a bath of the first aqueous solution comprising the first concentration of potassium hydroxide, step b) comprises immersing the crystalline silicon substrate in a bath of the second aqueous solution comprising the second concentration of potassium hydroxide, and step c) comprises immersing the crystalline silicon substrate in a bath of the alkaline solution.

12. The method of claim 10 wherein step b) comprises etching a layer of the crystalline silicon substrate.

13. The method of claim 10 wherein the performance of step a) results in the textured surface formed in step c) having a substantially homogeneous textural morphology.

14. The method of claim 10 wherein the textured surface comprises pyramid structures.

15. The method of claim 10 wherein steps a) through c) are performed sequentially and without a dedicated aqueous HF solution being applied to the crystalline silicon substrate.

16. The method of claim 10 wherein a layer of the crystalline silicon substrate is removed during step b), and wherein the layer of the crystalline silicon substrate removed during step b) is less than the entirety of the saw damage zone.

17. The method of claim 10 wherein the first concentration is in a range of 0.1% to 5% by weight and the second concentration is in a range of 20% to 40% by weight.

18. A method of manufacturing a solar cell comprising:
a) applying a pre-cleaning solution to an as-cut surface of a crystalline silicon substrate to remove surface contaminants, thereby converting the as-cut surface to a pre-cleaned surface, the as-cut surface formed by a sawing process to create the crystalline silicon substrate;
b) applying a first etching solution to the pre-cleaned surface to remove physical damage caused during the sawing process, thereby converting the pre-cleaned surface into a prepared surface;
c) applying a second etching solution to the prepared surface to texturize the prepared surface, thereby converting the prepared surface into a texturized surface; and
d) forming at least one solar cell on the texturized surface of the crystalline silicon substrate.

19. The method of claim 18 wherein organic, inorganic, films, ionic and particulate contaminants are removed during step a).

20. The method of claim 18 wherein steps a) through c) are performed sequentially and without a dedicated aqueous HF solution being applied to the crystalline silicon substrate.

* * * * *